US008816184B2

(12) United States Patent
Bettencourt

(10) Patent No.: US 8,816,184 B2

(45) Date of Patent: Aug. 26, 2014

(54) THERMOELECTRIC BIAS VOLTAGE GENERATOR

(75) Inventor: John P. Bettencourt, Danvers, MA (US)

(73) Assignee: Raytheon Company, Waltham, MA (US)

( * ) Notice: Subject to any disclaimer, the term of this patent is extended or adjusted under 35 U.S.C. 154(b) by 1791 days.

(21) Appl. No.: 11/291,371

(22) Filed: Dec. 1, 2005

(65) Prior Publication Data

US 2007/0125414 A1 Jun. 7, 2007

(51) Int. Cl.
*H01L 35/30* (2006.01)
*G05F 3/20* (2006.01)

(52) U.S. Cl.
CPC .......... *G05F 3/205* (2013.01)
USPC .......... 136/205

(58) Field of Classification Search
CPC .......... H01L 35/30
USPC .......... 136/205
See application file for complete search history.

(56) References Cited

U.S. PATENT DOCUMENTS

| | | | | |
|---|---|---|---|---|
| 4,787,686 | A * | 11/1988 | Tajima et al. | 327/308 |
| 4,855,246 | A * | 8/1989 | Codella et al. | 438/185 |
| 5,724,004 | A | 3/1998 | Reif et al. | |
| 5,793,194 | A | 8/1998 | Lewis | |
| 6,600,301 | B1 * | 7/2003 | DeFalco | 323/312 |
| 2003/0053516 | A1 * | 3/2003 | Atherton | 374/143 |
| 2005/0279398 | A1 | 12/2005 | Herrick et al. | |

FOREIGN PATENT DOCUMENTS

JP 2001-24445 A 1/2001

OTHER PUBLICATIONS

Dehé et al.: "GaAs Monolithic Integrated Microwave Power Sensor in Coplanar Waveguide Technology;" IEEE 1996 Microwave and Millimeter Wave Monolithic Circuits Symposium; XP 000683222; 0-7803-3360; Aug. 1996; pp. 179-182.

Strasser et al.: "Micromachined CMOS Thermoelectric Generators as On-Chip Power Supply;" The 12th Int'l Conf. on Solid State Sensors, Actuators and Microsystems; Boston, MA; Jun. 1002; pp. 45-48.

PCT Search Report and Written Opinion of the ISA dated Apr. 19, 2007.

Alfons Dehe, Klaus Fricke-Neuderth, Viktor Krozer, Broadband Thermoelectric Microwave Power Sensors Using GaAs Foundry Process, 2002, pp. 1829-1832, Germany.

Office Action from the Patent Office of the People Republic of China issued on Aug. 28, 2009.

Strasser et al., "Micromachined CMOS thermoelectric generators as on-chip power supply", Infineon Technologies AG, Memory Products, 81541 Munich Germany, Munich University of Technology, Institute for Physics of Electrotechnology, 80290 Munich, Germany, 2004, 9 pages.

* cited by examiner

*Primary Examiner* — Jennifer Michener
*Assistant Examiner* — Dustin Q Dam
(74) *Attorney, Agent, or Firm* — Daly, Crowley, Mofford & Durkee, LLP

(57) ABSTRACT

A thermoelectric bias voltage generator having a substrate, an active device formed in a semiconductor region of the substrate, and a thermoelectric junction disposed on the substrate and connected to the active device to provide the bias voltage for the active device.

15 Claims, 4 Drawing Sheets

THERMOELECTRIC BIAS VOLTAGE GENERATOR

TECHNICAL FIELD

This invention relates generally to bias voltage generators.

BACKGROUND

As is known in the art, many electronic devices require a bias voltage source to enable such device to operate in a desired operating region. For example, a transistor used to linearly amplify an input signal generally requires a bias voltage to enable the transistor to operate in its linear operating region.

More particularly, in one example, Depletion mode (D-Mode) MESFETS and HEMTS in some applications are required to operate with drain voltages set to a positive potential, sources set to ground and a negative bias (lower potential than Ground) applied to the gate. When D-mode FETS are used discretely or in integrated circuits any negative DC bias typically comes from an external negative power supply in addition to the positive DC supplies and ground connection.

There are two common approaches for supplying a negative DC bias to Depletion Mode FETS. The most common approach is an "off-chip" external DC power supply. A second more compact and integrated approach may use a DC-DC converter circuit requiring transistors, resistors, large capacitors, an oscillating signal and positive DC supply.

As is also known in the art, one source of electric potential is thermoelectric. One thermoelectric effect is the Seebeck effect. More particularly, a linear certain material combinations, called thermojunctions. A thermocouple is a device for measuring temperature that is made up of one or more thermoelectric junctions. Thermojunctions respond to this thermal gradient with a detectable voltage. It is based on the Seebeck effect (measured in volts per degree C.) in which a voltage appears between two dissimilar materials if a temperature gradient exists between two junctions along them. Sometimes many pairs of junctions or thermocouples are connected in series, where the net thermoelectric voltage produced by one thermocouple adds to that to the next, and so on. This multiple series connection yields a larger thermoelectric output. Such a series of thermocouple connections is called a thermopile. Thermopiles are place in close proximity to a heat source, usually a thin film resistor. The thermoelectric sensitivity would be equal to the voltage detected divided by power dissipated in heat source in V/W. Parameters employed to maximize thermopile thermoelectric output are: the number of thermopiles, thermopile length, thermopile width, thermopile pitch, and proximity to heat source.

As shown in the equations below, the sum of the temperature differentials ($T_i$, $T_o$) between the hot and cold junctions for a series of thermocouples is multiplied by the Seebeck coefficient ($\alpha_k$) to yield a detected voltage ($V_{out}$) for the thermopile. The sensitivity (S) is equal to the detected voltage divided over the power dissipated.

$$\text{Seebeck,} \quad \alpha_{tc} \sim 300\ \mu\text{V/C}$$

$$V_{out} = \alpha_{tc} \sum_{i=1}^{N} (T_i - T_o)$$

$$\text{Sensitivity,} \quad S = V_{out} / P_{diss}, \quad (\text{V/W})$$

As is known in the art, such thermopiles have been suggested for use as thermal sensors, reference being made to the following articles: "Broadband thermoelectric microwave power sensors using GaAs foundry process" by Dehe, A.; Fricke-Neuderth, K.; Krozer, V.; Microwave Symposium Digest, 2002 IEEE "MTT-S International, Volume: 3, 2002 Page(s): 1829-1832; "Free-standing $Al_{0.30}Ga_{0.70}As$ thermopile infrared sensor", by Dehe, A.; Hartnagel, H. L.; Device Research Conference, 1995. Digest. 1995 53rd Annual, 19-21 Jun. 1995 Page(s): 120-12; and "High-sensitivity microwave power sensor for GaAs-MMIC implementation" by Dehe, A.; Krozer, V.; Chen, B.; Hartnagel, H. L.; Electronics Letters, Volume: 32 Issue: 23, 7 Nov. 1996 Page(s): 2149-215, and an article by A. Dehe et al., entitled "GaAs Monolithic Integrated Microwave Power Sensor in Coplanar Waveguide Technology" published in the IEEE 1996 Microwave and Milli-meter Wave Monolithic Circuits Symposium, pages 179-181.

SUMMARY

I have now recognized that it would be desirable to produce this negative bias without the need for an external negative DC voltage supply. I have demonstrated that by using thermopiles, a negative potential can be produced from a positive DC voltage supply. This negative potential is suitable for use as a bias voltage to bias depletion-mode FETS in situations where minimal bias current is required. In this new approach a thermopile is used with its positive terminal ground referenced. When DC power is applied to the thermopile the thermoelectric potential generated at the negative junction can be less than ground and could be used to bias a D-mode FET. The thermopiles also can be built "on chip" next to transistors or networks requiring negative bias, providing a much more compact and integrated biasing technique when compared to using external negative DC bias or complicated DC-DC converters.

By using the thermoelectric properties of semiconductors and conductors, thermopiles can be fabricated monolithically with depletion mode FETS. The thermoelectric negative potential of the thermopile could be used for DC biasing of depletion mode FETS or networks requiring negative potential. This eliminates the need for external off chip/transistor power supplies or more complicated/area consuming DC converter type monolithic circuits.

Thus, in accordance with the invention, a thermoelectric bias voltage generator is provided having a substrate, an active device formed in a semiconductor region of the substrate, and a thermoelectric junction disposed on the substrate and connected to the active device to provide the bias voltage for the active device.

In one embodiment, the active device is a transistor. In one embodiment, the transistor has a control electrode for controlling carriers between a first electrode and a second electrode and wherein the input is the control electrode and wherein the thermoelectric junction provides a voltage potential to the control electrode.

In one embodiment, the voltage potential produced at the control electrode is negative relative to a voltage potential provided at the second electrodes of the transistor and wherein the first electrodes provides the output.

In one embodiment, the transistor is depletion mode field effect transistor and wherein the control electrode is the gate of such transistor.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
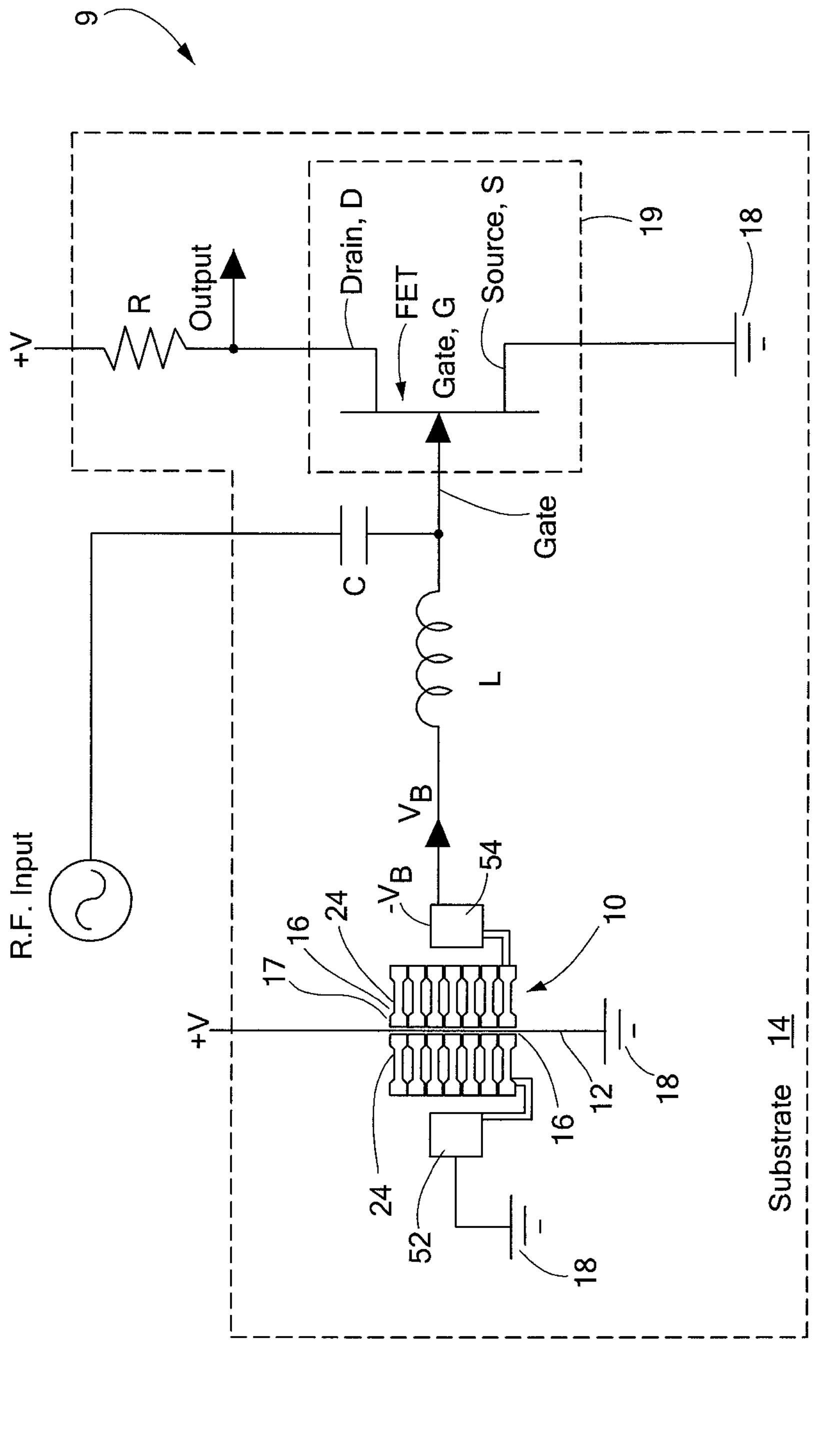
FIG. 1 is a schematic diagram of a circuit in accordance with the invention.

Referring now to FIG. 1, a circuit 9 is shown having a substrate 14; an active device, here a depletion mode Field Effect Transistor (FET) formed in a semiconductor region 19 of the substrate 14. The FET operates on an input signal RF INPUT fed to the gate electrode (G) of the FET to produce, in response to the input signal RF INPUT and a bias voltage, $V_B$, an output signal at the output, here the drain electrode, D, of the FET. The circuit 9 includes a thermopile 10, having a plurality of serially connected thermoelectric junctions, or thermocouples 24, described and shown in more detail in connection with FIGS. 2 and 3, disposed on the substrate 14 and connected to the FET to provide the negative DC bias voltage $V_B$ for the FET. Thus, the FET has a control electrode, here gate G, for controlling carriers between a first electrode (i.e., drain D) and a second electrode, here grounded drain electrode, D and the thermoelectric junctions of the thermopile 10 provides the bias voltage potential, here a negative voltage potential relative to ground, to the control electrode, G.

Completing the circuit 10 is an inductor L coupled between the DC bias voltage $V_B$ produced by the thermopile 10 and the gate electrode G. The input signal is here an RF signal, RF INPUT that is fed to the gate G through an AC coupling capacitor, C. The capacitor blocks any DC out of the RF INPUT and the inductor L blocks any RF from the RF INPUT from passing to the thermopile 10.

Here, the thermopile 10 is similar to that described in copending patent application Ser. No. 10/871,995 filed Jun. 18, 2004, entitled "Microwave Power Sensor", inventors, Katherine J. Herrick, John P. Bettencourt, and Alan J. Bielunis, assigned to the same assignee as the present invention, the entire subject matter thereof being incorporate herein by reference.

Figure 2:
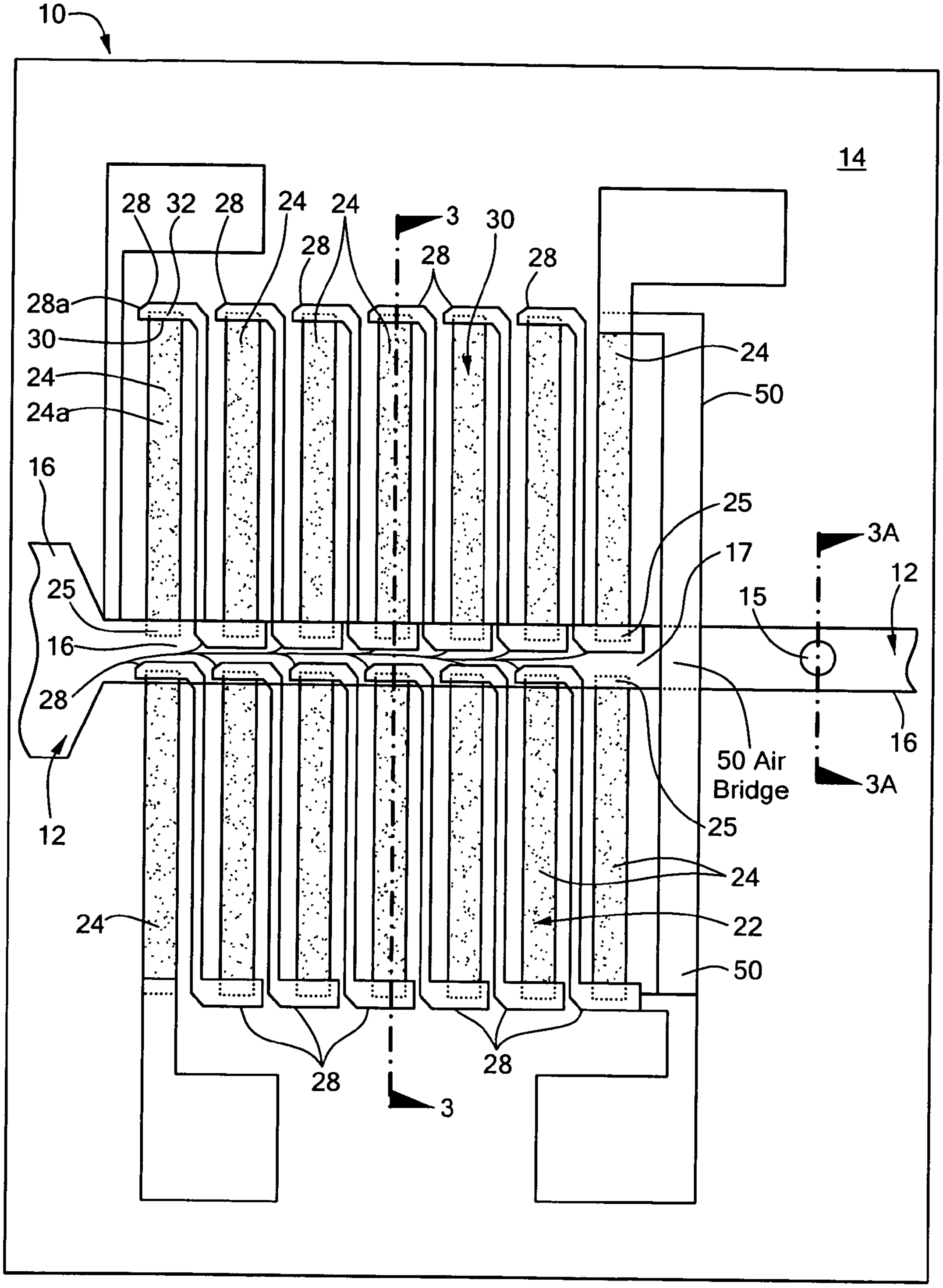
FIG. 2 is plan view sketch of a thermopile adapted for use in the circuit of FIG. 1.
Figure 3:
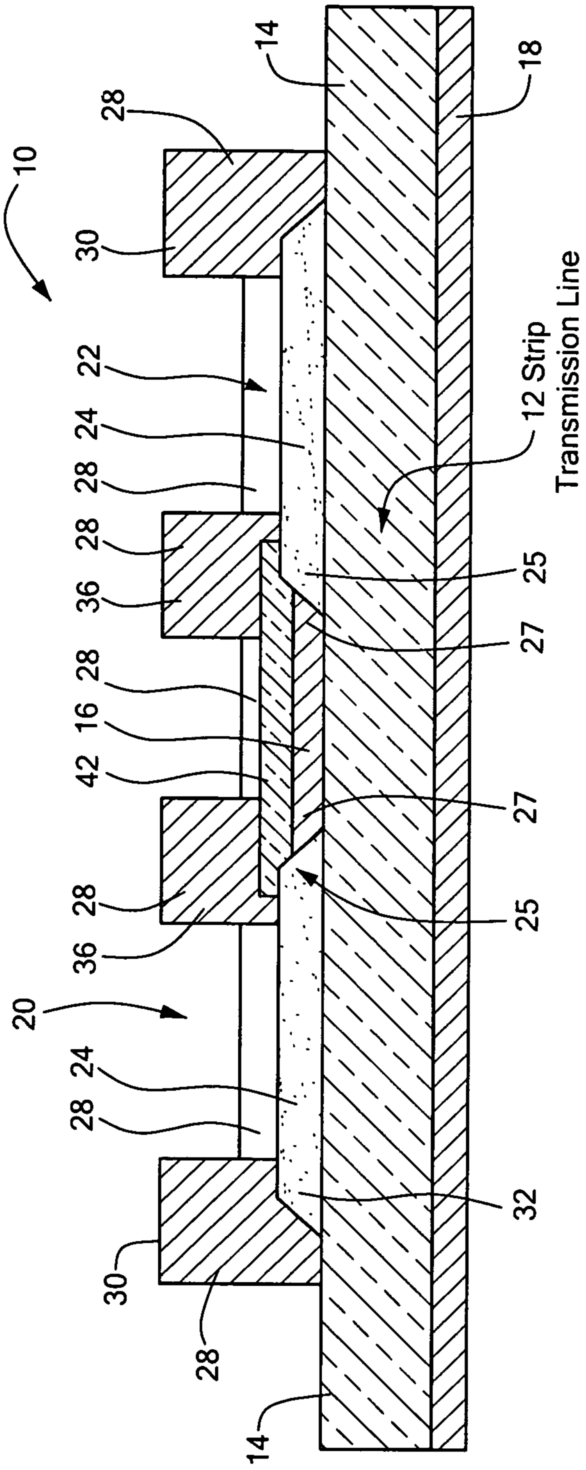
FIG. 3 is a cross-sectional view of the power sensor of FIG. 2, such cross section being taken along line-3-3 of FIG. 2.

Thus, referring now to FIGS. 2 and 3, the thermopile 10 includes a dielectric substrate 14; a resistor, here a strip resistive element 16, here made of a resistive material, here, for example, tantalum nitride, disposed on one surface, here the upper surface of the substrate 14; and a ground plane conductor 18 (FIG. 2) disposed on an opposite, here back, or lower, surface of the substrate 14. The thermopile 10 includes a pair of identical thermopile section 20, 22. Each one of the thermopile sections 20, 22 is on the same, here upper surface of the substrate 14 and on opposite sides (upper and lower sides in FIG. 2, left and right sides in FIG. 2) of the strip resistive element 16. Each one of the thermopile sections 20, 22 includes a plurality of, here seven, elongated, finger-like thermocouples 24 extending from the strip resistive element 16, proximal end portions 25 (shown more clearly in FIG. 3) of the thermocouples 24 being thermally coupled to the edge portions 27 of the strip resistive element 16.

Each one of the thermopile sections 20, 22 include a plurality, here six, electrically insulated of S-shaped electrical conductors 28, each one having a first end 30 electrically connected to a distal end 32 of a corresponding one of the thermocouples 24 and a second end 36 electrically connected to the proximal end portion 25 of one of the plurality of thermocouples 24 disposed adjacent to such corresponding one of the thermocouples 24, as shown more clearly in FIG. 3. The proximal ends 25 of the thermocouples 24 are electrically insulated one from the other by an insulating layer 42 (FIG. 3). The equivalent electrical circuit of the thermopile 10 is shown in FIG. 4.

Figure 4:
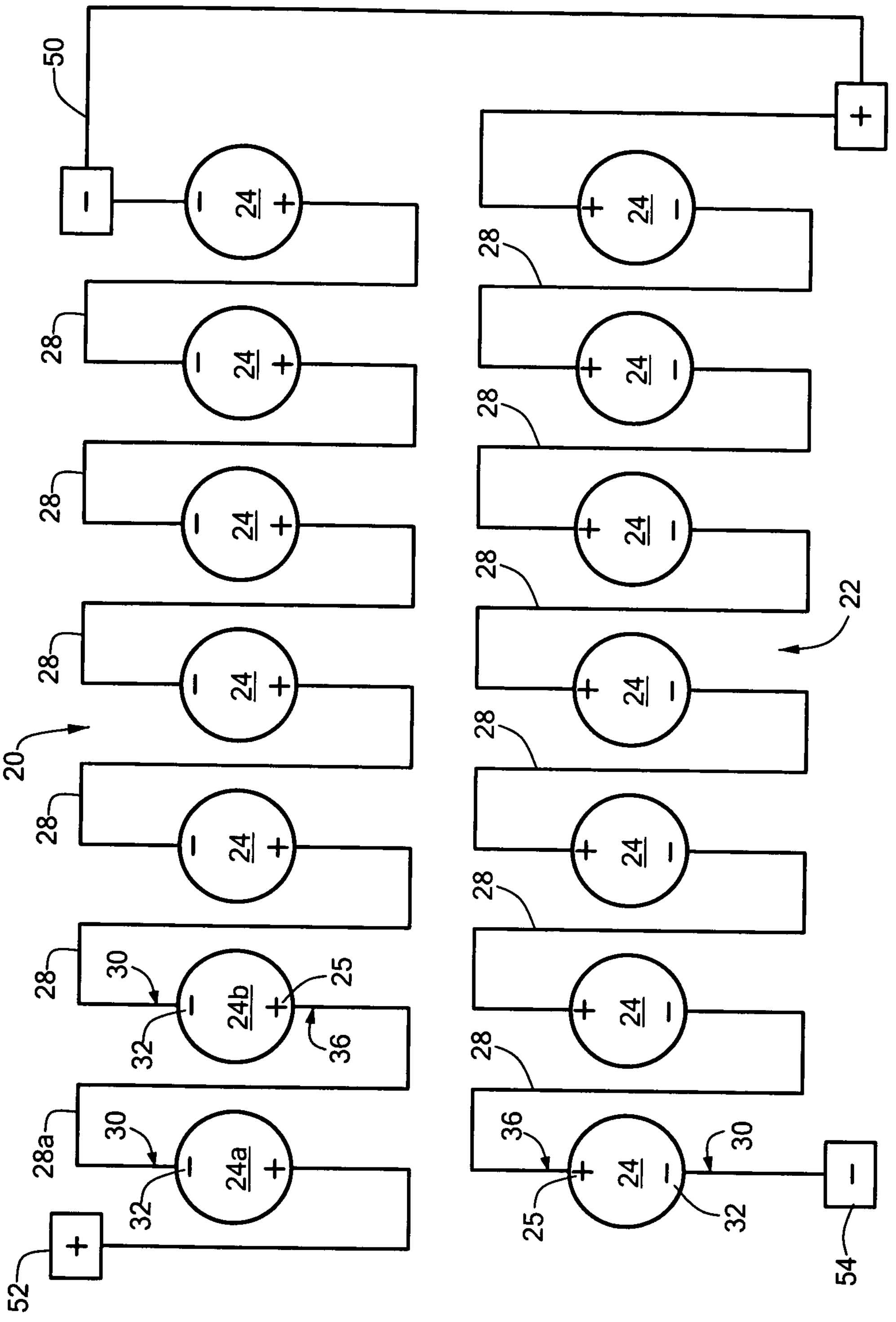
FIG. 4 is a schematic diagram of the power sensor of FIGS. 2 and 3.

Thus, as shown in FIG. 4, and considering the thermopile 20, a first one of the thermopiles 24, here labeled **24*a* has distal end 32 thereof electrically connected to first end 30 of one of the S-shaped electrical conductor 28, here labeled 28*a*. The second end 36 of the electrical conductor 28*a* is electrically connected to the proximal end 25 of the adjacent one of the thermocouples 24, here labeled 24*b*. It is noted that each thermocouple 28 produces a voltage V in response to the temperature difference across it, such temperature difference being related to the amount of DC power dissipated in the resistive element 16. More particularly, DC current passes from a positive potential relative to the potential of the ground plane conductor 18 DC source, +V, through resistive element 16 to the ground plane conductor 18, resulting in heat being generated in the resistive element 16**.

Figure 3A:
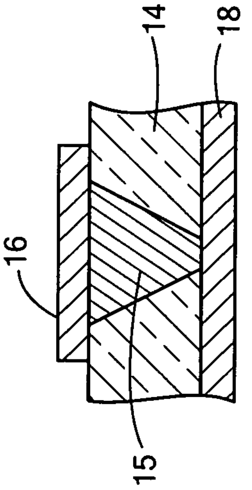
FIG. 3A is a cross-sectional view of the power sensor of FIG. 2, such cross section being taken along line-3A-3A of FIG. 2.

It is noted that the polarity of the voltage V is the same at the distal ends 32 of the thermopiles 28 is opposite (here labeled +) to the polarity (here labeled −) of the voltage V at the proximal ends 25 of the thermopiles 28, as shown in FIG. 3. The electrical conductors thereof serially connect the voltages V produced by the individual thermopiles 20, 22. The serially connected voltages of the two thermopiles 20, 22 are themselves serially connected by electrical conductor 50, such conductor 50 being formed as an air-bride over the conductor 16, as shown in FIG. 2. The distal end of the air bride is connected to the ground plane conductor through a conductive via 15 which passes through the structure to the ground plane conductor 18, as shown in FIG. 3A. The total voltage, here is 14 times V, appears at pads 52, 54, pad 52.

Here, the substrate 14 (FIG. 3) is a single crystal, III-V material, here GaAs. The thermopiles comprise GaAs material having epitaxial layers, not shown. Here, the thermocouples 14 are mesas on the substrate 14 and extend perpendicular from 16. Here, referring to FIG. 3, the proximal end portions 25 of the thermocouples 28 are disposed in an overlying relationship with the edge portions 27 of the resistive element 16. More particularly, here the proximal end portions 25 of the thermocouples are disposed under, and are thermally coupled, to the strip resistive element 16, here made of resistive material. here, for example, tantalum nitride.

The thermopile 10 is here formed by the following method. The semi-insulating single crystal substrate 10 is provided. A plurality of GaAs mesas is formed on a surface of the substrate to provide the thermocouples 24. The strip resistive element 16 is disposed on the surface of the structure and is then patterned with edge portions 27 thereof disposed on proximate end portions 25 of the thermocouples 24. As noted above, the thermocouples 24 extend outwardly from (here perpendicular to) the strip resistive element 16. The insulating layer 42 is disposed and patterned to be disposed over the surface on the strip resistive element 16. It is noted that the patterning exposes edge portions of the thermocouples 24 (i.e., the portions of the thermocouples 24 adjacent to the proximal ends 25 and distal ends 32 thereof, as shown in FIG. 3).

The plurality of electrical conductors 28 is formed, each one having the first end 28 disposed on, and electrically connected, the distal end 32 of a corresponding one of the thermocouples 24 and a second end 36 disposed on, and electrically connected to, the proximate end 25 of one of the plurality of thermocouples 24 disposed adjacent to such corresponding one of the thermocouples 24 as described above in connection with FIG. 3 and exemplary thermocouples 24*a*, 24*b*. The plurality of electrical conductors 28 are here gold/doped AlGAs and are electrically insulated one from the other and from the strip resistive element 16 by the insulating layer 16 (FIG. 3). It is noted that the ground plane conductor 18 and conductive via 15 may be formed prior to, or subsequent to, the formation of the mesa thermocouples 24.

For this application heat from the resistive material of strip resistive element 16, i.e., to form the resistor 16, with positive potential +V applied is used to induce a temperature gradient across the thermopile. If the positive end of the thermopile 10 is "ground" referenced the induced voltage at the negative end will be lower than ground.

During the manufacture of GaAs transistors and integrated circuits there are semiconductor layers and metals available for formation of thermocouples and thermopiles. Here, the thermopile is fabricated using a PHEMT integrated circuit process. In this case available doped AlGaAs semiconductor layers and gold form a thermoelectric junction.

Heat for developing a temperature gradient comes from the strip resistive element 16. This strip resistive element 16 is electrically isolated from thermocouple by the insulating layer 42, here silicon nitride. Positive potential is applied across the heating resistor, causing a temperature gradient from the strip resistive element 16 outward. This gradient causes the Seebeck effect resulting in a voltage across the thermopile. The higher potential (+) thermopile junction is set to ground, the negative junction is at a potential less than ground.

The TABLE below presents measurements of the thermopile output voltage. Input power was supplied from a DC power supply with its potential set above ground. All output voltages in the last column were less than the ground reference . . . Negative!

TABLE

| DC voltage In (v) | DC power in (W) | Negative voltage Out (V) |
|---|---|---|
| 5 | 0.295 | −0.19 |
| 6 | 0.43 | −0.303 |
| 7 | 0.592 | −0.466 |
| 8 | 0.782 | −0.689 |

It is noted that the measurements of negative voltage generated for dissipated DC power. Note "negative voltage out".

A number of embodiments of the invention have been described. For example, the DC source being used to heat the strip resistive element 16 may be an ac or microwave source. Nevertheless, it will be understood that various modifications may be made without departing from the spirit and scope of the invention. Accordingly, other embodiments are within the scope of the following claims.

What is claimed is:

1. A circuit comprising;

a substrate;

an active device formed in a semiconductor region of the substrate, such active device having an input and an output, for operating on an input signal fed to the input to produce, in response to the input signal, an output signal at the output;

a thermoelectric device bias voltage generator:

a heating element;

a thermocouple thermally coupled to the heating element;

a pair of terminals for coupling to a DC voltage power supply, the voltage power supply providing a positive potential relative to a reference potential, the positive potential being at one of the pair of terminals and the reference potential being at the other one of the pair of terminals;

an output terminal for producing the bias voltage for the active device;

a fourth terminal connected to the reference potential;

wherein the output terminal is coupled to the input of the active device; and wherein the heating element is serially connected between: the positive potential provided by the DC voltage power supply; and, the reference potential with DC current passing from the positive potential provide by the voltage power supply through the heating element to the reference potential, the thermocouple producing, in response to heat in the heating element generated from the current passing through such heating element, a potential more negative than the reference potential at the output terminal to provide the bias voltage for the active device.

2. The circuit recited in claim 1 wherein the active device is a transistor.

3. The circuit recited in claim 2 wherein the transistor has a control electrode for controlling carriers between a first electrode and a second electrode and wherein the output terminal is coupled to the control electrode.

4. The circuit recited in claim 3 wherein the voltage potential produced at the control electrode is negative relative to a voltage potential provided at the second electrode of the transistor and wherein the first electrode provides the output.

5. The circuit recited in claim 4 wherein the transistor is depletion mode field effect transistor and wherein the control electrode is the gate of such transistor.

6. The circuit recited in claim 1 wherein the active device is a depletion mode field effect transistor and wherein the output terminal is coupled to the gate of such transistor.

7. The circuit recited in claim 2 wherein the active device is a depletion mode field effect transistor and wherein the output terminal is coupled to the gate of such transistor.

8. The circuit recited in claim 4 wherein the active device is a depletion mode field effect transistor and wherein the output terminal is coupled to the gate of such transistor.

9. The circuit recited in claim 1 wherein the active device is electrically connected between the pair of terminals, one of the pair of terminals having the potential more positive than the reference potential and the other one of the pair of terminals being at the reference potential.

10. The circuit recited in claim 9 wherein the DC voltage power supply is disposed off of the substrate for producing the potential more positive than the reference potential.

11. The circuit recited in claim 1 wherein the DC voltage power supply is disposed off of the substrate for producing the potential more positive than the reference potential.

12. A circuit comprising;

a substrate;

an active device formed in a semiconductor region of the substrate, such active device having an input and an output, for operating on an input signal fed to the input to produce, in response to the input signal, an output signal at the output;

a thermoelectric device bias voltage generator disposed on the substrate and connected to the active device to provide a bias voltage for the active device, said bias voltage generator having:

a pair of terminals for coupling to a positive DC potential relative to a reference potential;

an output terminal for producing the bias voltage for the active device;

a fourth terminal connected to the reference potential;

wherein one of the pair of terminals is at the reference potential and the other one of the pair of being coupled to the positive potential;

wherein the output terminal is coupled to the input of the active device; and wherein the positive potential is coupled to both the device and the thermoelectric device bias voltage generator, the thermoelectric device bias voltage generator being serially connected between: the positive potential; and, the reference potential;

wherein current passes between the positive potential and the reference potential through the thermoelectric bias voltage generator and in response to such current the thermoelectric bias voltage generator produces a potential more negative than the reference potential at the output terminal of the bias voltage generator to provide the bias voltage for the active device.

13. The circuit recited in claim 12 including a DC voltage power supply disposed off of the substrate for producing the positive potential.

14. The circuit recited in claim 13 wherein the active device is a transistor having a control electrode for controlling carriers between a first electrode and a second electrode and wherein the output terminal is coupled to the control electrode and wherein first electrode and a second electrode are electrically connected between the positive potential and the reference potential.

15. The circuit recited in claim 12 wherein the thermoelectric bias voltage generator transforms the positive potential into a negative bias potential for the active device.

* * * * *